(12) United States Patent
Kahrimanovic et al.

(10) Patent No.: US 10,426,028 B2
(45) Date of Patent: Sep. 24, 2019

(54) PRINTED CIRCUIT BOARD WITH INSULATED METAL SUBSTRATE MADE OF STEEL

(71) Applicant: Infineon Technologies Austria AG, Villach (AT)

(72) Inventors: Elvir Kahrimanovic, Villach (AT); Wai Keung Alan Lun, Hong Kong (HK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/992,406

(22) Filed: May 30, 2018

(65) Prior Publication Data

US 2018/0352653 A1 Dec. 6, 2018

(30) Foreign Application Priority Data

Jun. 1, 2017 (DE) .......................... 10 2017 112 048

(51) Int. Cl.
*H01L 23/495* (2006.01)
*H05K 1/05* (2006.01)
*H05K 1/02* (2006.01)
*H01L 23/373* (2006.01)

(52) U.S. Cl.
CPC ......... *H05K 1/056* (2013.01); *H01L 23/3735* (2013.01); *H01L 23/49548* (2013.01); *H01L 23/49562* (2013.01); *H01L 23/49568* (2013.01); *H01L 23/49582* (2013.01); *H05K 1/0204* (2013.01); *H05K 2201/068* (2013.01); *H05K 2201/10166* (2013.01)

(58) Field of Classification Search
CPC .......... H01L 23/49562; H01L 23/3735; H01L 23/49568; H01L 23/49548; H01L 23/49582; H05K 1/0204; H05K 1/056
USPC ........................................................ 257/666
See application file for complete search history.

(56) References Cited

U.S. PATENT DOCUMENTS

| | | | |
|---|---|---|---|
| 4,617,729 A | 10/1986 | Celnik | |
| 7,834,433 B2 * | 11/2010 | Xiaochun | H01L 23/49524 257/625 |
| 8,069,559 B2 * | 12/2011 | Chun | B32B 15/08 29/831 |
| 9,214,415 B2 * | 12/2015 | Denison | H01L 24/34 |
| 9,905,500 B2 * | 2/2018 | Padmanabhan | H01L 23/49575 |
| 2007/0257343 A1 | 11/2007 | Hauenstein et al. | |
| 2010/0171543 A1 * | 7/2010 | Korec | H01L 23/49524 327/436 |
| 2012/0273034 A1 | 11/2012 | Sato et al. | |

* cited by examiner

*Primary Examiner* — Luan C Thai
(74) *Attorney, Agent, or Firm* — Murphy, Bilak & Homiller, PLLC

(57) ABSTRACT

A power electronic device includes an Insulated Metal Substrate Printed Circuit Board (IMS PCB) and a power semiconductor device package. The power semiconductor device package includes a lead frame configured to electrically and mechanically couple the power semiconductor device package to the IMS PCB. The lead frame has a rigid configuration and is made of a lead frame material having a first thermal expansion coefficient. The IMS PCB includes an insulated metal substrate made of a substrate material having a second thermal expansion coefficient within a range of 60% to 140% of the first thermal expansion coefficient.

15 Claims, 5 Drawing Sheets

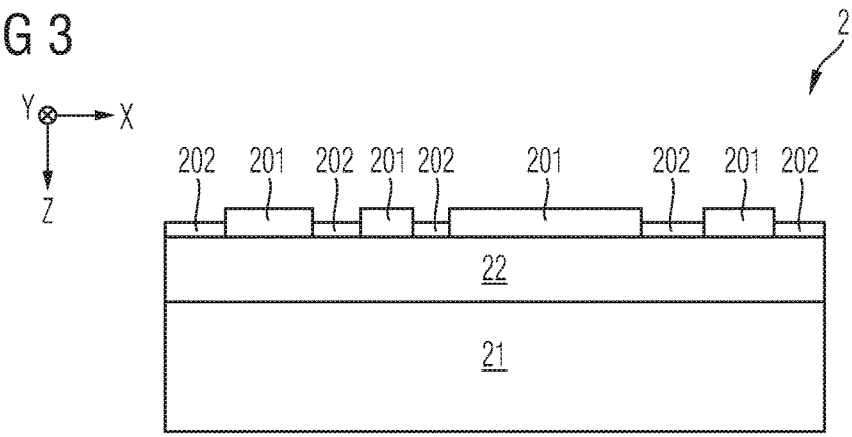
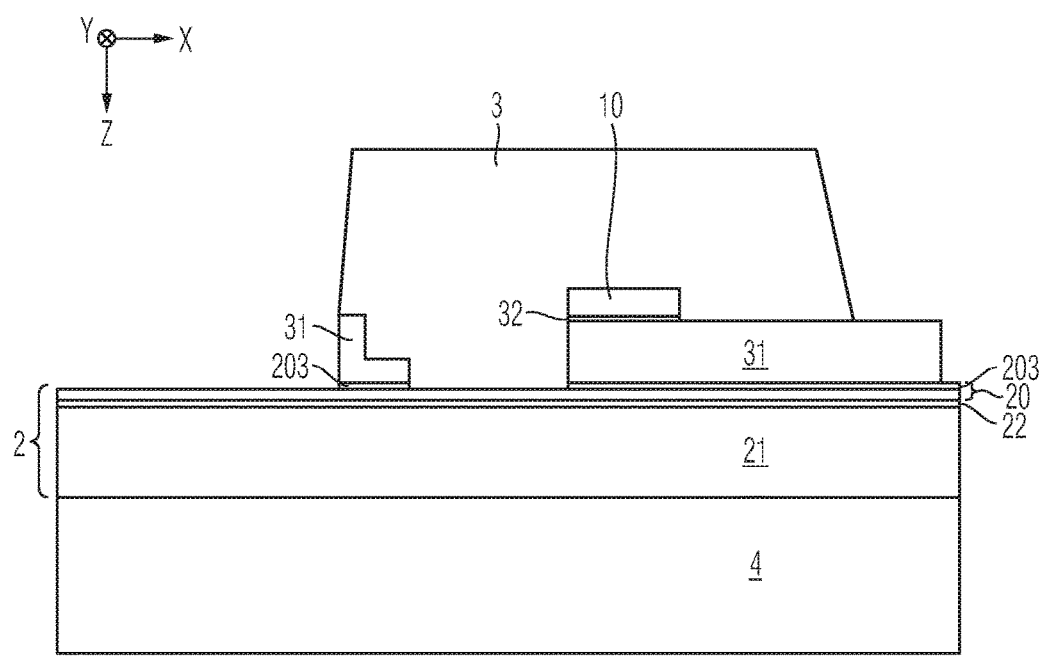

PRINTED CIRCUIT BOARD WITH INSULATED METAL SUBSTRATE MADE OF STEEL

TECHNICAL FIELD

This specification refers to embodiments of a power electronic device that comprises an Insulated Metal Substrate Printed Circuit Board and a power semiconductor device package. In particular, this specification refers to embodiments of a power electronic device with an Insulated Metal Substrate Printed Circuit Board that includes an insulated metal substrate and that is coupled to a rigid package by means of one or more solder joints.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

After a power semiconductor die has been manufactured, it has to be included within a package, e.g., in a manner that allows the die to be installed within an application, e.g., in a power converter, e.g., such that the die may be coupled to a support, e.g., a printed circuit board (PCB).

To this end, a technology commonly referred to as surface-mount technology (SMT) is known, wherein this notion may generally refer to producing electronic circuits in which the components are mounted or placed directly onto the surface of PCBs. For example, the PCB may include a copper layer that may allow for attaching components to the PCB by means of soldering.

A certain group of PCBs is called Insulated Metal Substrate PCB (in short: IMS PCB), wherein instead of a usual base material a metal, such as aluminum, can be used as a carrier for said copper layer. For example, the insulated metal substrate can be used for the thermal management of a power electronic circuit mounted on the IMS PCB.

SUMMARY

Certain aspects of the present specification are related to an IMS PCB with an insulated metal substrate that is made of a steel, e.g., in the context of packages that have a rigid, e.g., leadless configuration.

According to an embodiment, a power electronic device comprises an Insulated Metal Substrate Printed Circuit Board, in the following referred to as IMS PCB, and a power semiconductor device package, in the following referred to as package, wherein: the package includes a lead frame that is configured to electrically and mechanically couple the package to the IMS PCB, wherein the lead frame has a rigid configuration and is made of a lead frame material having a first thermal expansion coefficient; and wherein the IMS PCB includes an insulated metal substrate that is made of a substrate material having a second thermal expansion coefficient within the range of 60% to 140% of the first thermal expansion coefficient. Said range can be even smaller, e.g., 60% to 120%, 80% to 110%, or 90% to 105%, or even 95% to 105%, in accordance with an embodiment. For example, the lead frame material, e.g. copper, has a first thermal expansion coefficient within the range of $16*10^{-6}$ m/(m K) to $17*10^{-6}$ m/(m K). The substrate material may be steel with a second thermal expansion coefficient within the range of $11*10^{-6}$ m/(m K) to $13*10^{-6}$ m/(m K), or stainless steel with a second thermal expansion coefficient within the range of $10*10^{-6}$ m/(m K) to $18*10^{-6}$ m/(m K), or stainless steel austenitic with a second thermal expansion coefficient within the range of $14*10^{-6}$ m/(m K) to $18*10^{-6}$ m/(m K), or stainless steel ferritic with a second thermal expansion coefficient of about $10*10^{-6}$ m/(m K).

For example, each of the first thermal expansion coefficient and the second thermal expansion coefficient can be a respective linear thermal expansion coefficient. For example, if the lead frame material has a first thermal expansion coefficient of $16.5*10^{-6}$ m/(m K), this may imply that the lead frame of a total extension of 1 cm extends by 16.5 μm, if its temperatures raises by 100 K.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals may designate corresponding parts. In the drawings:

FIG. 3 schematically and exemplarily illustrates a section of a vertical cross-section of a power electronic device in accordance with one or more embodiments;

FIG. 4 schematically and exemplarily illustrates a section of each of a side view and a vertical cross-section of a power electronic device in accordance with one or more embodiments;

DETAILED DESCRIPTION

Figure 1:
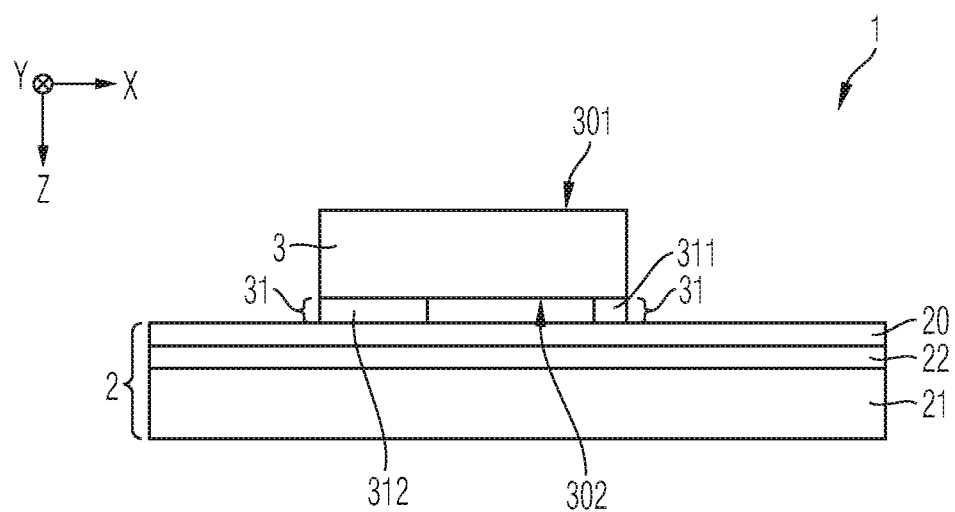
FIG. 1 schematically and exemplarily illustrates a section of a vertical cross-section of a power electronic device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like; i.e., said two elements may be in touch with each other.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, to a power electronic device that comprises an Insulated Metal Substrate Printed Circuit Board, in the following referred to as IMS PCB, and a power semiconductor device package, in the following referred to as package, coupled to the IMS PCB. The package may house a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification intends to describe a single die with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V.

For example, the power semiconductor die may be a die that is configured to be employed as a power component in a low-, medium- and/or high voltage application. Further, the term "power semiconductor die" as used in this specification is not directed to logic semiconductor devices that are used for, e.g., storing data, computing data and/or other types of semiconductor based data processing.

Before being able to be employed within an application, the power semiconductor die is usually included within a package that may allow mechanically mounting and electrically connecting the die within the application, e.g., also for heat distribution purposes. As has been introductorily mentioned, this may include applying the surface-mount technology (SMT).

Exemplary embodiments of the package disclosed herein concern a package with a lead frame that has a rigid configuration, e.g., a leadless configuration, such as the Transistor Outline (TO) Leadless® package. Such lead frame may interface with an IMS PCB, e.g., by means of a solder joint. A general idea of some embodiments is to match the thermal expansion coefficients of the lead frame and of the insulated metal substrate of the IMS PCB. This may allow for stabilizing the solder joint, as the mechanical stress to which it may be subjected due to thermal expansions of components within the package and within the IMS PCB is reduced. For example, the lead frame is made of copper. Further, the insulated metal substrate can be made of steel or copper.

FIG. 1 schematically and exemplarily illustrates a section of a vertical cross-section of a power electronic device 1 in accordance with an embodiment. The following description may apply to each of FIG. 1 to FIG. 6, if not explicitly stated otherwise.

The illustrated vertical cross-sections may be parallel to the first lateral direction X and the vertical direction Z. Each of the illustrated components may extend along the second lateral direction Y.

The device 1 may comprise an Insulated Metal Substrate Printed Circuit Board 2, in the following referred to as IMS PCB 2, and a power semiconductor device package 3, in the following referred to as package 3, coupled thereto. The package 3 may have an SMT configuration; for example, the package 3 is not embedded within the IMS PCB 2.

For example, the IMS PCB 2 may be arranged in a horizontal orientation and the package may be arranged on top of the IMS PCB 2, e.g., vertically displaced from the IMS PCB 2.

The package 3 may enclose a power semiconductor die (not illustrated), in the following also referred to as die. The package 3 may entirely surround the die and seal the die against the environment. To this end, the package 3 may comprise common materials and components, such as a housing, insulating material, molding mass etc. For example, the die has one of a power semiconductor diode configuration and a power semiconductor transistor configuration, e.g., a MOSFET configuration, an IGBT configuration, or a configuration derived from these basic configurations. The die may comprise a first load terminal and a second load terminal and the die may be configured to conduct a load current between these load terminals. The load current may be up to 300 A, for example within the range of 10 A to 50 A. The maximum load current that can continuously be conducted by the die can be indicated by a load current rating of the die. Further, the die that may be enclosed in the package 3 may be configured to block a voltage between the first load terminal and the second load, e.g., within the range of 10 V to 500 V, e.g., within the range of 50 V to 300 V. The maximum voltage that can continuously be blocked by the die can be indicated by a blocking voltage rating of the die. In an embodiment, the die can be one of power diode, in which case the first load terminal can be anode port and the second load terminal can be cathode port, a power IGBT, in which case the first load terminal can be an emitter terminal and the second load terminal can be collector terminal, a MOSFET, in which case the first load terminal can be a source terminal and the second load terminal can be drain terminal, or a power device derived from one or more of these basic configurations, e.g., a JFET (Junction Field Effect Transistor), sometimes referred to as SFET (German: Sperrschicht Feld Effekt Transistor). For example, the second load terminal can be arranged at a die backside and can be formed by means of a backside metallization. In an embodiment, the die includes only the second load terminal at the die backside and no other terminal is arranged on the die backside. Further, on a die frontside where the first load terminal may be arranged, there may additionally be arranged at least one further terminal, e.g., at least one of a sensor terminal and a control terminal, e.g., a gate terminal in case the die is implemented controllable device, such as an MGD or a transistor, e.g., MOSFET or an IGBT. For example, the further terminal (e.g. the control terminal and/or the sensor terminal) may be electrically insulated from each of the first load terminal and the second load terminal. The die can be sandwiched in between a package top side 301 and a package footprint side 302.

The package 3 is coupled to the IMS PCB 2. For example, the package 3 includes a lead frame 31 that is configured to electrically and mechanically couple the package 3 to the IMS PCB 2. The IMS PCB may comprise a surface layer 20, wherein the lead frame 31 can be soldered to the surface layer 20.

Figure 2A:
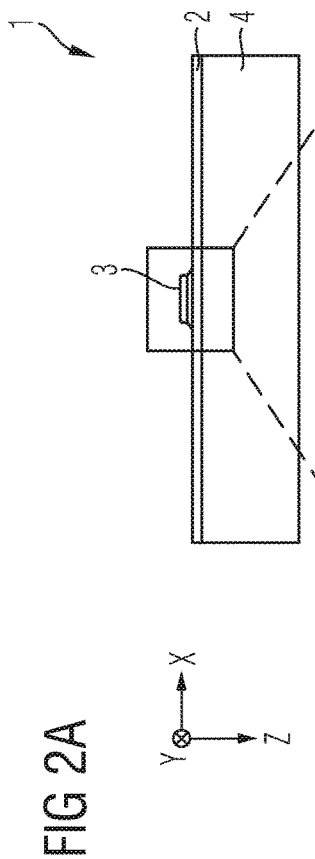
FIG. 2A-2B schematically and exemplarily illustrate a section of a vertical cross-section of a power electronic device in accordance with one or more embodiments.
Figure 2B:
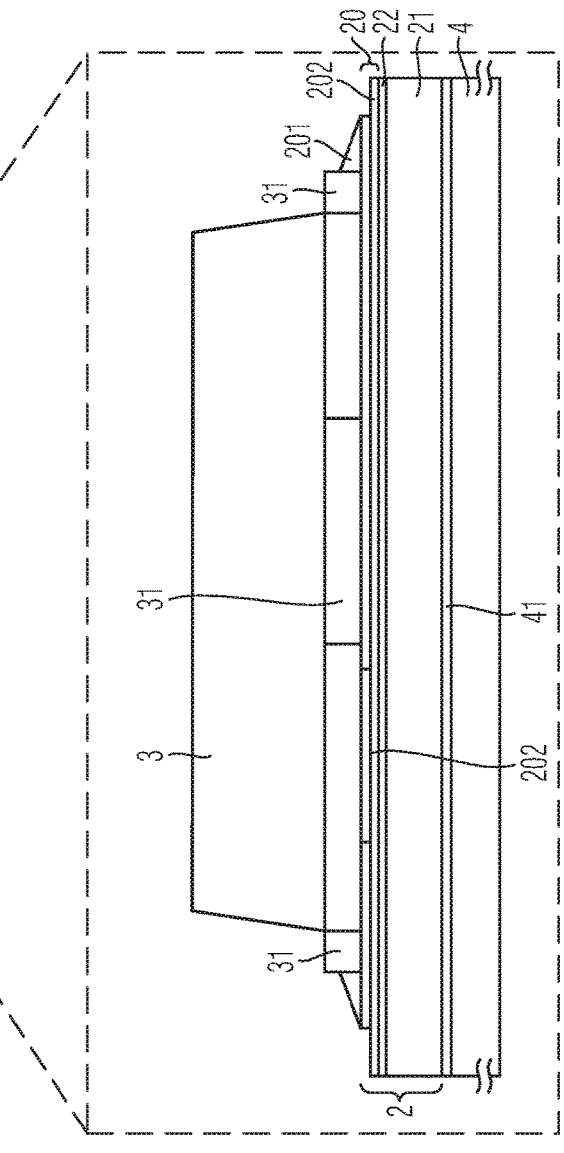

An exemplary configuration of the surface layer is illustrated in FIG. 3, according to which the surface layer 20 may comprise at least one of a solder foil layer 201 and a solder resist layer 202 (cf. also FIG. 2B). For example, the solder foil layer 201 is made of copper. Each of the solder foil layer 201 and the solder resist layer 202 may be laterally structured.

Figure 5A:
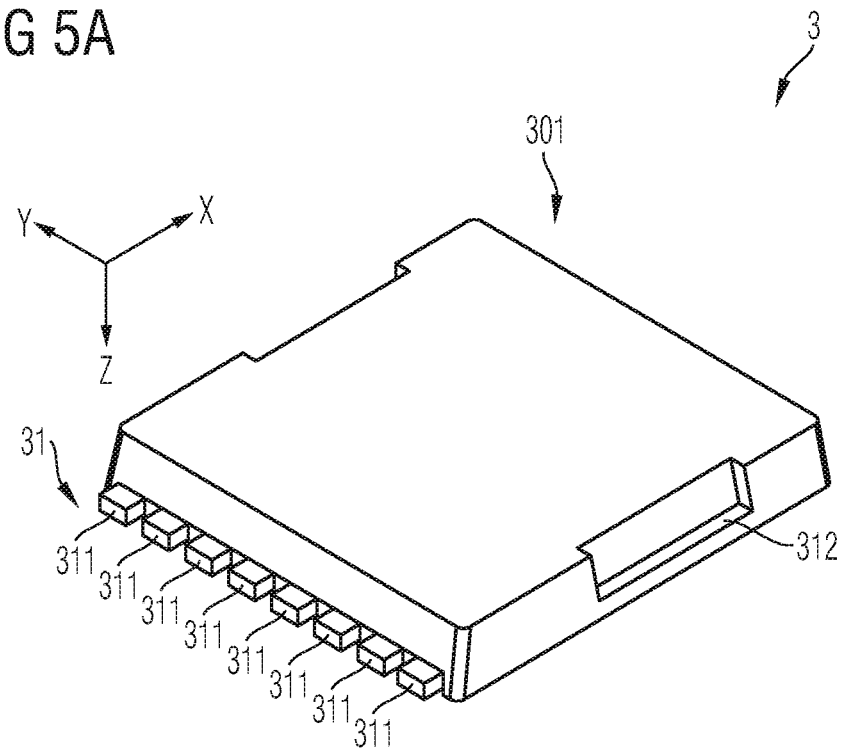
FIG. 5A-5B each schematically and exemplarily illustrate a section of a perspective view of a package in accordance with one or more embodiments.
Figure 5B:
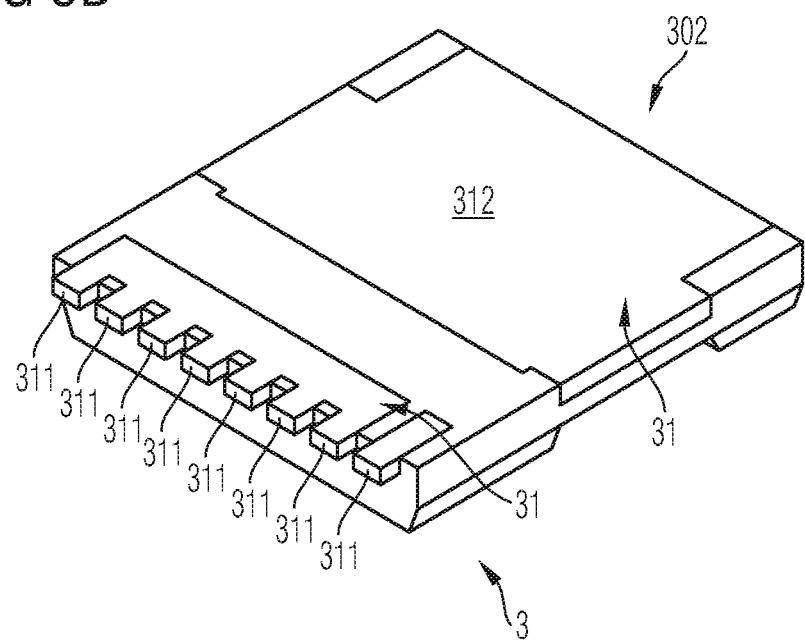

For example, a main part of the lead frame 31 is enclosed within a housing of the package 3 and only one or more contacts of the lead frame 31 extend out of the housing of the package 3. An exemplarily configuration of the package 3 and its lead frame 31 is illustrated in FIGS. 5A-5B, wherein FIG. 5A illustrates a view on the top side 301 and FIG. 5B a view on the footprint side 302. For example, first contacts 311 extend out of the housing of the package 3 at the package footprint side 302 and a second contact 312 may also be arranged at the package footprint side 302. For example, each of the first contacts 311 and the second contact 312 are flat contacts. For example, the first contacts 311 may be electrically connected with one of the first load terminal and the second load terminal of the die enclosed in the package 3, and the second contact 312 may be electrically connected with the other one of the first load terminal and the second load terminal of the die.

In an embodiment, the package 3 is a leadless package 3. For example, the leadless package 3 may be realized by means of a lead frame 31 that has a rigid configuration. The rigid configuration of the lead frame 31 can be formed, e.g., by flat contacts, as exemplarily illustrated in FIGS. 5A-5B (cf. contacts 311 and 312). In an embodiment, the lead frame 31 does not comprise any flexible contacts, such as wire-like contacts. For example, the lead frame 31 (having the rigid configuration) is configured not to follow an expansion of the surface layer 20, e.g., not to follow an expansion to the same extent as an expansion of the surface layer 20. This optional aspect will be explained in more detail below. For example, the contacts 311 and 312 are coupled to the surface layer 20 by means of a rigid solder joint.

Figure 6:
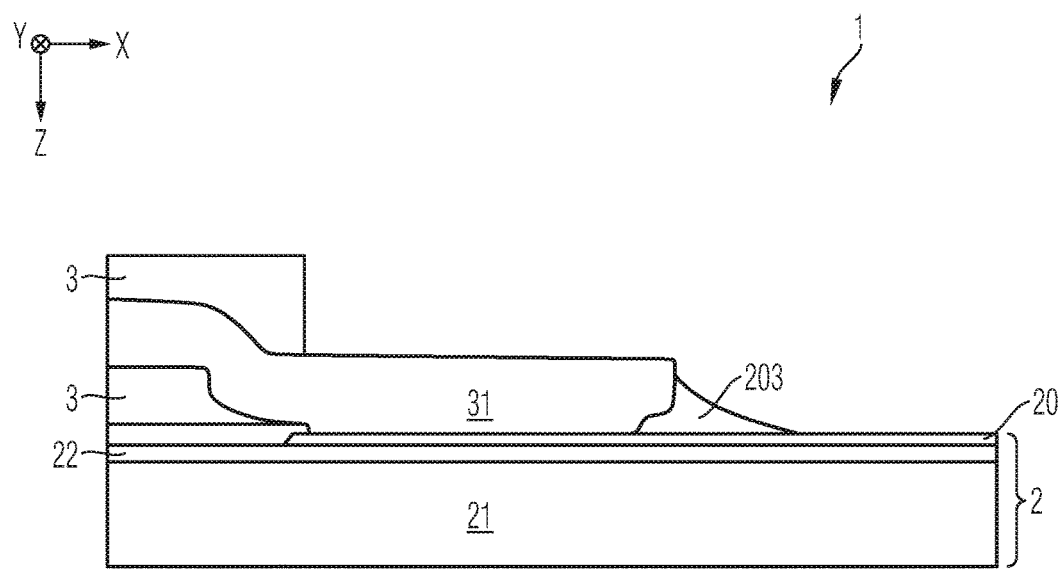
FIG. 6 schematically and exemplarily illustrates a section of a vertical cross-section of a power electronic device in accordance with one or more embodiments.

An exemplary configuration is illustrated in FIG. 6, where a flat contact of the lead frame 31 is mounted on the surface layer 20 of the IMS PCB 2 by means of a rigid solder joint 203.

The lead frame 31 can be configured such that its contacts 311 and 312 serve as spacers; for example, in regions where the lead frame 31 does not interface with the surface layer 20, there can be an empty space (e.g. indicated in the left section of FIG. 6 with the non-referenced area between the dielectric layer 22 and the package 3, as well as in FIG. 1 with the non-referenced area between the surface layer 20, the package 3 and the contacts 311 and 312).

The lead frame 31 may be made of a lead frame material having a first thermal expansion coefficient. For example, the lead frame material is copper and/or the first thermal expansion coefficient essentially is the thermal expansion coefficient of copper. For example, the first thermal expansion coefficient is within the range of $16*10^{-6}$ m/(m K) to $17*10^{-6}$ m/(m K).

The IMS PCB 2 to which the package 3 is coupled by means of the lead frame 31 may include an insulated metal substrate 21. For example, the insulated metal substrate 21 is made of a substrate material having a second thermal expansion coefficient within the range of 60% to 140% of the first thermal expansion coefficient. Said range can be even smaller, e.g., 60% to 120%, 80% to 110%, or 90% to 105%, or even 95% to 105%, in accordance with an embodiment. For example, the lead frame material, e.g., copper has a first thermal expansion coefficient within the range of $16*10^{-6}$ m/(m K) to $17*10^{-6}$ m/(m K). The substrate material may be steel with a second thermal expansion coefficient within the range of $11*10^{-6}$ m/(m K) to $13*10^{-6}$ m/(m K), or stainless steel with a second thermal expansion coefficient within the range of $10*10^{-6}$ m/(m K) to $18*10^{-6}$ m/(m K), or stainless steel austenitic with a second thermal expansion coefficient within the range of $14*10^{-6}$ m/(m K) to $18*10^{-6}$ m/(m K), or stainless steel ferritic with a second thermal expansion coefficient of about $10*10^{-6}$ m/(m K).

In an embodiment, exemplary substrate materials include at least one of a steel, a stainless steel, a zinc coated steel, a steel alloy with chromium content, for example, with a minimum of about 10% chromium content by mass, steel type 304, electrolytic zinc-coated steel sheet (SECC). However, no matter which substrate material is ultimately chosen for the insulated metal substrate 21, it shall be ensured that the corresponding second thermal expansion coefficient of the substrate material is within said range of the first thermal expansion coefficient of the lead frame material.

As illustrated, the IMS PCB 2 may further comprise a dielectric layer 22 that is arranged between the surface layer 20 and the insulated metal substrate 21. For example, the dielectric layer 22 is arranged in contact with each of the surface layer 20 and the insulated metal substrate 21. The dielectric layer 22 may be configured to provide for an electrical insulation between the surface layer 20 and the insulated metal substrate 21.

As has been illustrated above, the lead frame material, e.g., copper, and a material present in the surface layer 20, e.g., the solder foil layer 201 which may be made of copper, can be identical to each other. However, the volume of the insulated metal substrate 21 may be significantly larger than the volume of the surface layer 20, a thermal behavior of the surface layer 20 may be influenced or even predominantly determined by the insulated metal substrate 21, e.g., the second thermal expansion coefficient of the substrate material may influence or even determine a thermal expansion of or, respectively, within the surface layer 20. As has been explained above, the materials of the lead frame 31 and the insulated metal substrate 21 may differ from each other, wherein the lead frame material may be approximately identical to the material of the solder foil layer 201. For example, the lead frame 31 (having the rigid configuration) is configured not to follow an expansion of the surface layer 20, e.g., not to follow an expansion to the same extent as an expansion of the surface layer 20.

The dielectric layer 22 can have a thermal conductivity of greater than 1 W/mK, e.g., a thermal conductivity of about 1.3 W/mK. The dielectric layer 22 can have a thickness of 160 μm or less, e.g., a thickness along the vertical direction Z within the range of 40 μm to 120 μm. The thermal conductivity of the dielectric layer 22 can be within the range of 1 to 20 W/mK.

The dielectric layer 22 can be made of a material comprising Nippon Rika:NRA-ES® or Nippon Rika:NRA-ES1®. For example, the dielectric layer 22 exhibits a dielectric constant within the range of 4 to 6.

The insulated metal substrate 21 can have a thickness along the vertical direction Z far greater than the thickness of the dielectric layer 22, e.g., greater than 0.3 mm, greater than 0.4 mm or even greater than 0.5 mm.

Further, the insulated metal substrate 21 can have a thermal conductivity greater than 60 W/mK, e.g., a thermal conductivity of about 80 W/mK.

Regarding the embodiments illustrated in FIGS. 2A-2B and 4, it shall further be noted that the IMS PCB 2 can be configured to be coupled to a heat sink 4 of the power electronic device 1. For example, the IMS PCB 2 can comprise a coupling layer 41, e.g., an adhesive layer that may be arranged in contact with each of the insulated metal substrate 21 and the heat sink 4. Further referring to schematic illustration of FIG. 4, a semiconductor portion 10 of the die enclosed by the package 3 may be coupled to the lead frame 31 by means of a coupling structure 32, e.g., a rigid solder joint. As has been explained above, the lead frame 31 may be attached to the surface layer 20 by means of a rigid solder joint, as illustrated in FIG. 4 with reference numeral 203. The transfer of heat produced by the enclosed die within the package 3 may thus occur along the vertical direction Z, namely via the solder joint 203 and through each of the surface layer 20, the dielectric layer 22, the insulated metal substrate 21 down to the heat sink 4.

In accordance with one or more embodiments, a power electronic device comprising a leadless package coupled to an IMS PCB that has an insulated metal substrate made of a steel is provided. Due to an approximately close match between the thermal expansion coefficients of a lead frame of the leadless package and the insulated metal substrate, favorable Temperature Cycling on Board (TCoB) results may be achieved and cracks within solder joints that couple the lead frame to the IMS PCB may be avoided in a cost-effective manner.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power electronic device, comprising
an Insulated Metal Substrate Printed Circuit Board (IMS PCB)
a power semiconductor device package comprising a lead frame, a semiconductor die, and an electrically insulating housing;
the lead frame having a rigid configuration and being made of a lead frame material having a first thermal expansion coefficient,
wherein the semiconductor die is enclosed within the housing;
wherein the semiconductor die comprises a first terminal;
wherein the lead frame comprises a contact with a first end that is enclosed within the housing and a second end that is exposed from the housing,
wherein the contact is electrically connected to the first terminal, and
wherein the semiconductor device package is mounted on top of the IMS PCB with the second end of the contact directly facing and electrically contacting the IMS PCB,
wherein the IMS PCB comprises an insulated metal substrate made of a substrate material having a second thermal expansion coefficient within a range of 60% to 140% of the first thermal expansion coefficient.

2. The power electronic device of claim 1, wherein the second thermal expansion coefficient is within a range of 80% to 110% of the first thermal expansion coefficient.

3. The power electronic device of claim 1, wherein the second thermal expansion coefficient is within a range of 90% to 105% of the first thermal expansion coefficient.

4. The power electronic device of claim 1, wherein the lead frame comprises copper.

5. The power electronic device of claim 1, wherein the insulated metal substrate comprises steel or copper.

6. The power electronic device of claim 1, wherein the insulated metal substrate is made of a stainless steel or a zinc coated steel.

7. The power electronic device of claim 1, wherein the power semiconductor device package is a leadless package.

8. The power electronic device of claim 1, wherein the insulated metal substrate is configured for coupling to a heat sink of the power electronic device and has a thermal conductivity greater than 60 W/mK.

9. A method of manufacturing a power electronic device, the method comprising:
   providing an Insulated Metal Substrate Printed Circuit Board (IMS PCB) and a power semiconductor device package comprising a lead frame, a semiconductor die, and an electrically insulating housing
   the lead frame having a rigid configuration and being made of a lead frame material having a first thermal expansion coefficient, the IMS PCB comprising an insulated metal substrate made of a substrate material having a second thermal expansion coefficient within a range of 60% to 140% of the first thermal expansion coefficient,
   wherein the semiconductor die is enclosed within the housing;
   wherein the semiconductor die comprises a first terminal;
   wherein the lead frame comprises a contact with a first end that is enclosed within the housing and a second end that is exposed from the housing,
   wherein the contact is electrically connected to the first terminal, and
   wherein the method further comprises mounting the power semiconductor device package on the IMS PCB such that the second end of the contact directly faces and electrically contacts the IMS PCB.

10. The method of claim 9, wherein the insulated metal substrate comprises a stainless steel or a zinc coated steel.

11. The method of claim 9, further comprising coupling the insulated metal substrate to a heat sink, wherein the insulated metal substrate has a thermal conductivity greater than 60 W/mK.

12. The power electronic device of claim 1, wherein the IMS PCB comprises a dielectric layer completely covering the insulated metal substrate, and a conductive surface layer formed on the dielectric layer, and wherein the semiconductor device package is mounted on the IMS PCB such that the second end of the contact faces and is electrically connected to the conductive surface layer.

13. The power electronic device of claim 12, wherein the second end of the contact comprises an outer surface that is coplanar with an outer surface of the housing.

14. The method of claim 9, wherein the IMS PCB comprises a dielectric layer completely covering the insulated metal substrate, and a conductive surface layer formed on the dielectric layer, and wherein the semiconductor device package is mounted on the IMS PCB such that the second end of the contact faces and is electrically connected to the conductive surface layer.

15. The method of claim 14, wherein the second end of the contact comprises an outer surface that is coplanar with an outer surface of the housing.

* * * * *